US006045711A

United States Patent [19]

Wang et al.

[11] Patent Number: 6,045,711

[45] Date of Patent: Apr. 4, 2000

[54] VACUUM SEAL FOR FIELD EMISSION ARRAYS

[75] Inventors: Wen-Chun Wang; Chun-hui Tsai; Chih-Hao Tien, all of Hsinchu, Taiwan

[73] Assignee: Industrial Technology Research Institute, Hsin-Chu, Taiwan

[21] Appl. No.: 08/999,228

[22] Filed: Dec. 29, 1997

[51] Int. Cl.[7] .......... H01L 21/302

[52] U.S. Cl. .......... 216/2; 216/11; 216/13; 216/24; 216/33; 216/41; 216/75; 216/100; 445/25; 445/50; 445/51; 438/20; 438/125

[58] Field of Search .......... 216/2, 11, 13, 216/24, 33, 41, 75, 100; 445/25, 50, 51; 438/20, 125; 174/17.08; 220/2.1 R; 65/42, 43, 58

[56] References Cited

U.S. PATENT DOCUMENTS

| | | | |
|---|---|---|---|
| 3,885,860 | 5/1975 | Sorkin | 350/160 LC |
| 4,426,673 | 1/1984 | Bell et al. | 361/283 |
| 5,157,304 | 10/1992 | Kane et al. | 313/495 |
| 5,227,583 | 7/1993 | Jones | 174/52.4 |
| 5,600,203 | 2/1997 | Namikawa et al. | 313/495 |
| 5,652,083 | 7/1997 | Kumar et al. | 430/315 |
| 5,653,017 | 8/1997 | Cathey et al. | 29/830 |
| 5,772,488 | 6/1998 | Cathey et al. | 445/50 |
| 5,882,533 | 3/1999 | Ozawa et al. | 216/11 |
| 5,910,705 | 6/1999 | Cathey et al. | 313/496 |

*Primary Examiner*—Randy Gulakowski
*Assistant Examiner*—Anita Alanko
*Attorney, Agent, or Firm*—George O. Saile; Stephen B. Ackerman

[57] ABSTRACT

A vacuum seal suitable for use with field emission arrays is described. This seal has high reliability because the expansion coefficients of the metal and the glass are closely matched. Materials traditionally used for cathode and gate lines continue to be employed. To achieve this, a gap is introduced into each conductive line near the edges of the display. This gap is bridged by a material having an expansion coefficient that more closely matches that of the glass used for the seal and is the only material that contacts the seal. The bridge may be in the form of a deposited layer or it may be a discrete wire. A description of how the structure is manufactured is also provided.

10 Claims, 3 Drawing Sheets

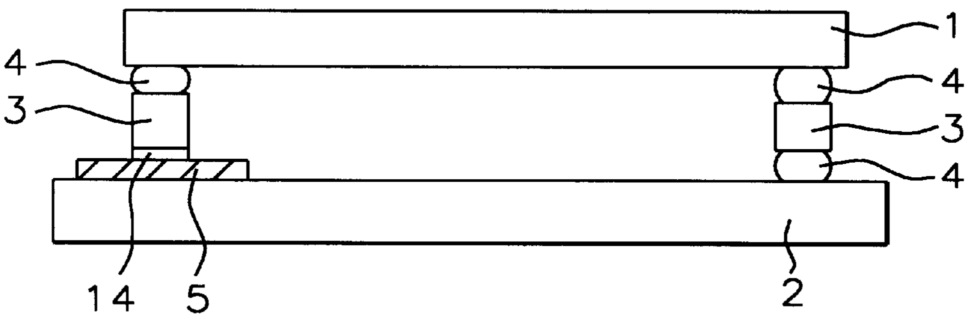
FIG. 1 – Prior Art
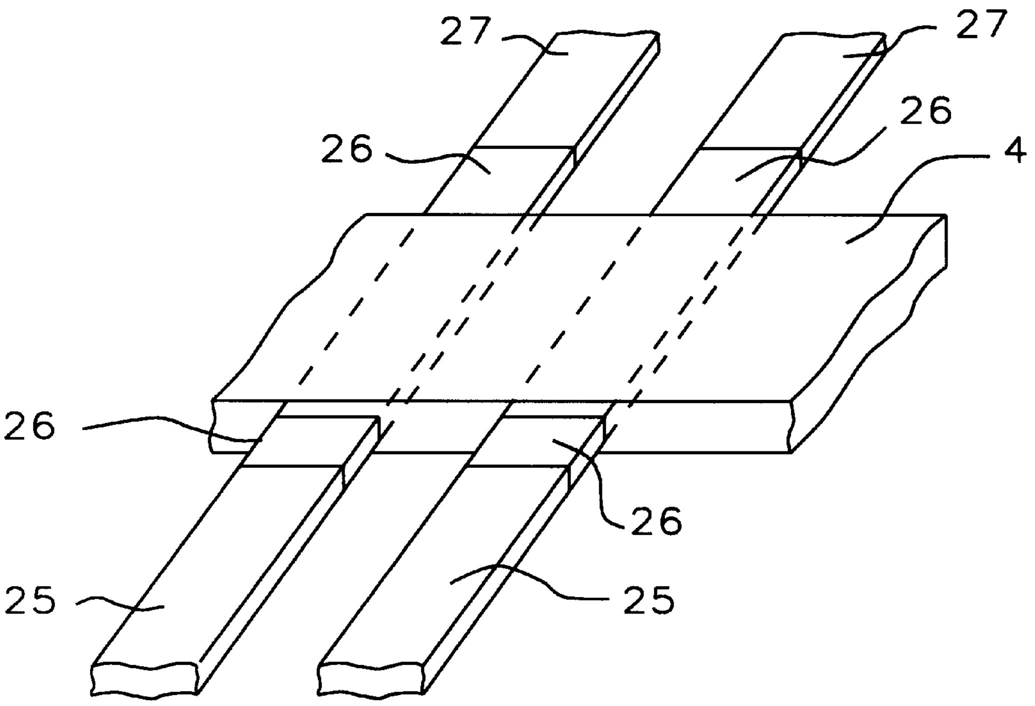
FIG. 2

VACUUM SEAL FOR FIELD EMISSION ARRAYS

BACKGROUND OF THE INVENTION (1) Field of the Invention

The invention relates to the general field of field emission arrays with particular reference to how the enclosure is sealed and metal leads brought out from the interior vacuum.

(2) Description of the Prior Art

Field Emission Arrays (FEAs) are most commonly packaged between flat glass plates. The cathode lines, microtips, and (orthogonal) gate lines are formed on one plate (the rear plate) while the fluorescent screen, which also acts as the anode, is formed on the other plate (the front plate). To control the gate to anode separation, glass spacers, located along the outer edges of the plates, are placed between them and then sealed to the plates by means of glass frit. The assembly is then given a suitable heat treatment so that the frit fuses and bonds to the plates and the spacers, after which it is allowed to return to room temperature.

During subsequent processing the inside of the FEA assembly is evacuated to a very high degree of vacuum (generally better than about 1 microtorr) and permanently sealed. Because the effectiveness of the field emitting microtips is readily degraded by the presence of gaseous contaminants, it is essential that the initial vacuum be maintained within the FEA enclosure throughout its operating life. To this end, standard gettering techniques are used but, if a very slow leak is present, the getter will eventually be saturated and performance of the FEA will start to degrade. Since this type of problem may take substantial time before it manifests itself, testing at the factory may not identify its presence prior to sale of the product.

Referring now to FIG. 1, we show a schematic view of an FEA enclosure. Front plate 1 is seen to be mounted on rear plate 2 with spacers 3 located between them. Fused glass frit 4 is seen as forming the bond between spacers and plates. Also shown is conductive lead 5 which passes from inside the enclosure (i.e. the vacuum) to the outside (i.e. the air). On the inside, 5 would normally be the termination of a cathode or gate line while on the outside it would normally be attached to a flexible lead of some sort. In the prior art, 5 has been a single continuous line of a single material. The glass frit to which 5 bonds (designated as 14 in the figure) has the same composition as the frit 4 used at other locations.

For reasons relating to the performance requirements of FEAs the preferred materials for making leads such as 5 have been molybdenum and niobium. These refractory metals have low coefficients of thermal expansion and are therefore not a good match for the relatively high expansion coefficient glass frits. This mismatch in expansion coefficients can lead to microcracking at the metal-glass interface and/or open circuiting of lines such as 5. It is not possible to use frits having lower expansion coefficients because this would raise their softening temperatures to unacceptably high values.

A number of vacuum seals suitable for use with FEAs have been described in the prior art but none is entirely free of the above described problems. Thus Kane et al. (U.S. Pat. No. 5,157,304 October 1992) teach use of a special interface layer that is first formed on the rear plate to facilitate bonding between the two plates with continuous wire leads passing directly over, and resting on, this interface layer. In one embodiment of their invention, the FEA is formed on a silicon substrate (as opposed to the rear glass plate itself) and low resistance (doped) regions are formed in the silicon for the purpose of underlying their interface layer, presumably with a view to minimizing any loss in planarity.

Chirino et al. (U.S. Pat. No. 4,293,325 October 1981) describe the formation of high temperature hermetic seals suitable for joining ceramics. These seals are based on glass frit compositions but have a high metallic content. Thus they are cermets rather than glasses and are poor electrical insulators.

Mariani (U.S. Pat. No. 5,059,848 October 1991) describes a vacuum tight package for a SAW (surface acoustic wave) device. Unbroken bus bars of uniform composition run out of the vacuum, through the seal, out into the air.

Hertz (U.S. Pat. No. 5,195,019 March 1993) teaches the encapsulation of a capacitor stack by first coating it with glass frit and then fusing the frit. To make contact with the capacitor's two electrodes, wires are attached to these electrodes prior to application of the frit. These wires protrude through the frit and become bonded to it when it fuses.

SUMMARY OF THE INVENTION

It has been an object of the present invention to provide a glass-metal seal, suitable for field emission arrays, that has long life and low failure rate.

Another object of the present invention has been that said seal be readily manufacturable with minimum perturbation of existing processes for manufacturing field emission arrays.

These objects have been achieved by introducing a gap in the conductive lines (cathode and gate) that conduct power and information from the outside air into the enclosed vacuum of the array. The gap is bridged by a material having an expansion coefficient that more closely matches that of the glass used for the seal and is the only material that contacts the seal. This bridge may be in the form of a deposited layer or it may be a discrete wire.

BRIEF DESCRIPTION OF THE DRAWINGS

FIG. 1 is a schematic cross-sectional view of a field emission array of the prior art showing how a single uniform lead is used to connect points in air to points in vacuum.

FIG. 2 illustrates the essence of the present invention wherein the material that passes through the glass frit seal is different from the materials to which electrical contact is made.

DESCRIPTION OF THE PREFERRED EMBODIMENTS

Figure 3:
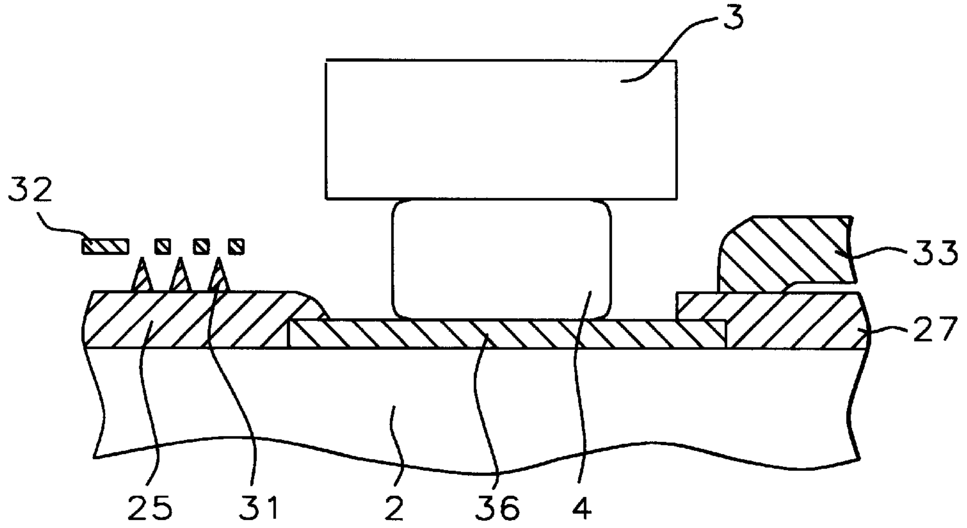
FIGS. 3 and 4 are closeup views of the glass seal of the FEA showing how the material through the seal differs from that both inside and outside the vacuum.

FIG. 2 is a idealized drawing that illustrates the basic principles of the present invention. Shown are two leads that pass through a layer 4 of fused glass frit. Each lead is seen to be made up of three separate sections 25, 26, and 27. Section 25 is located on the vacuum side of the fused frit seal and would be part of an FEA such as a cathode line or a gate line. As such it is fabricated from a refractory metal such as molybdenum, niobium, tungsten, or molybdenum tungstide. Section 26, which is bonded to the fused frit, is made of a different conductive material selected because its coefficient of thermal expansion more closely matches that of the frit, than the metal of section 25 does, and because it is chemically stable relative to the frit.

Last, is section 27 which is connected to 26. 27 is out on the air side of the seal. As far as the integrity of the seal is concerned, 27 could be of the same composition as 26 but it is preferable to use the same material for both 25 and 27 because processes already in place during the manufacture of FEAs, such as the attachment of flexible leads, are intended for use with the material of 25. Note that fused frit layer 4 contacts only section 26 and not 25 or 27. To make certain that this is the case, a small amount of 26 protrudes from either side of 4.

We begin our description of a first embodiment of the invention by referring to FIG. 3. A schematic representation of a field emission device is shown. It is made up of cathode line 25 which rests on rear plate 2, microtips such as 31 and a gate line 32 which runs at right angles to 25. During operation of the device, electrons are extracted from microtips 31 through the application of voltage to 32. These electrons pass through the openings in 32 and continue on to the fluorescent anode on the underside of the front plate (not shown in this figure but corresponding to 1 in FIG. 1).

Both the cathode and the gate lines need to make connections to points outside the vacuum. The latter is enclosed by fused frit seal 4, spacer 3 and the front plate (as seen in FIG. 1). Gate line 32 runs at right angles to 25 and will also lie on 2, but at a point somewhere above the plane of the figure. Thus it will pass through the frit seal in a similar manner to 25.

Figure 5:
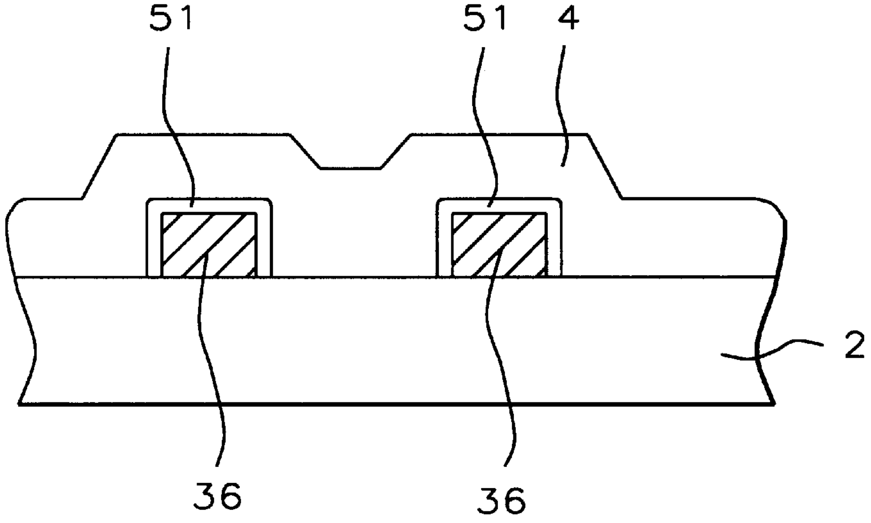
FIG. 5 illustrates an optional feature of the invention wherein a layer of oxide is inserted between the sealant metal and the fused glass frit.

Connected to 25 is link 36, formed from a layer of material on the surface of 2, which has a closer expansion match to frit 4, through which it passes, than does 25. The other end of 36 connects to 27 which is of the same material as 25. Also shown is flexible lead 33 that is attached to 27. An optional extra feature is a layer of oxide (typically silicon oxide but others, such as chromium oxide or stannous oxide, could also be used) between 36 and 4. This is illustrated in FIG. 5 which shows two instances of 36 viewed in a direction perpendicular to the view presented in FIG. 3. The layer of oxide 51 is shown, being between 36 and seal 4.

Figure 4:
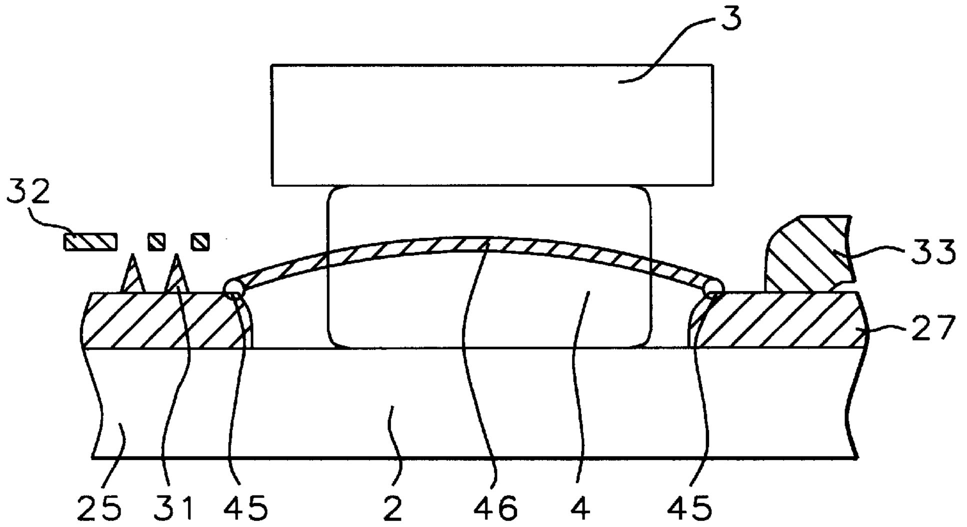

A second embodiment of the invention is illustrated in FIG. 4 which is similar to FIG. 3 except that layer 36 has been replaced by free standing wire 46 which has been attached, using standard wire bonding techniques, to 25 and 27 at points 45. As was the case for 36 in FIG. 3, 46 protrudes out of both ends of seal 4 i.e. neither 25 nor 27 are touched by 4.

The starting point for the manufacture of the first of the above two embodiments is rear plate 2 on which link 36 is formed, by means of chemical vapor deposition (CVD) or physical vapor deposition (PVD) followed by patterning and etching into a line shape, or directly by screen printing. The thickness of link 36 is between about 1,000 and 100,000 Angstroms. Materials suitable for link 36 include chromium, silver (if screen printing was used), and nickel-iron. This is followed by the formation of the cathode and gate lines using standard deposition and etching methods except that these lines, instead of being of uniform composition now include a section (the link) that is made of material that more closely matches the thermal expansion of the glass frit. 25 and 27 are between about 1,000 and 10,000 Angstroms thick and overlap 36 by between about 0.1 and 10 microns. The length of 36 is between about 1 and 5 mm.

A layer of glass frit 4 is now laid down over 2 and 36, care being taken to ensure that it does not touch either 25 or 27.

The frit is normally applied as a paste formed by mixing it with a solvent and a binder, the proportions being adjusted to optimize ease of dispersion and viscosity. Once the frit is in position, glass spacer 3 is laid on top of it and the assemblage is heated at between about 300 and 600° C. for between about 30 and 180 minutes so that the frit fuses. This allows the glass plate, the spacer, and the link to all bond together, following which the assemblage is allowed to return to room temperature. Note that, in practice, all the spacers of the assemblage, as well as both front and rear glass plates, are all bonded together in a single operation. The description given above has been focussed on the formation of the vacuum seal and the lead passing through it.

Manufacture of the second embodiment follows a process that is similar to that described above except no link layer gets formed. Instead, the cathode and gate lines are formed in the usual way except that there is a gap (measuring between about 1 and 5 mm.) present in them in the region where the seal will be formed, close to the outer edge of the rear plate. Prior to forming the seal, wire 46 is bonded to the ends of 25 and 27. Formation and fusing of the seal then proceeds as described above for the first embodiment.

While the invention has been particularly shown and described with reference to the preferred embodiments thereof, it will be understood by those skilled in the art that various changes in form and details may be made without departing from the spirit and scope of the invention.

What is claimed is:

1. A method of forming a connection, between an object in a vacuum and an object in air, comprising the steps of:

providing a glass plate having an outer edge;

depositing a first conductive layer on said glass plate;

patterning and etching said first conductive layer to form a link having first and second ends;

depositing a second conductive layer on said glass plate and to said link;

patterning and etching said second conductive layer to form a first lead which overlaps the link by a first amount and extends away from the outer edge;

patterning and etching said second conductive layer to form a second lead which overlaps the link by a second amount and extends towards the outer edge;

depositing a layer of glass frit on the glass plate, over the link in an area between the first and second leads;

resting a glass spacer on said layer of glass frit;

heating the glass frit to a temperature such that it fuses, thereby bonding itself to the spacer, the link, and the glass plate; and allowing the glass frit to cool to room temperature.

2. The method of claim 1 wherein the step of depositing the first conductive layer further comprises chemical vapor deposition, physical vapor deposition, or screen printing.

3. The method of claim 1 wherein said first and second amounts are each between about 1 and 10 microns.

4. The method of claim 1 wherein the glass frit further comprises a mixture of glass frit with a binder and a solvent.

5. The method of claim 1 wherein the step of heating the glass frit to a temperature such that it fuses further comprises heating to a temperature between about 300 and 600° C. for between about 30 and 180 minutes.

6. A method of forming a connection, between an object in a vacuum and an object in air, comprising the steps of:

providing a glass plate having an outer edge;

depositing a conductive layer on said glass plate;

patterning and etching said conductive layer to form colinear first and second leads extending inwards from said outer edge and separated by a gap;

bonding a wire so as to connect said first and second leads across said gap;

depositing a layer of glass frit on the glass plate in the gap whereby the wire is fully surrounded by glass frit;

resting a glass spacer on said layer of glass frit;

heating the glass frit to a temperature such that it fuses, thereby bonding itself to the glass plate, the spacer, and the wire; and allowing the glass frit to cool to room temperature.

7. The method of claim 6 wherein the step of depositing the first conductive layer further comprises chemical vapor deposition, physical vapor deposition, or screen printing.

8. The method of claim 6 wherein the gap is between about 1 and 5 mm.

9. The method of claim 6 wherein the glass frit further comprises a mixture of glass frit with a binder and a solvent.

10. The method of claim 6 wherein the step of heating the glass frit to a temperature such that it fuses further comprises heating to a temperature between about 300 and 600° C. for between about 30 and 180 minutes.

* * * * *